(12) United States Patent
Rand et al.

(10) Patent No.: US 10,332,718 B1
(45) Date of Patent: Jun. 25, 2019

(54) COMPACT DEFLECTING MAGNET

(71) Applicant: IMATREX, INC., Las Vegas, NV (US)

(72) Inventors: Roy E. Rand, Portola Valley, CA (US); Vitaliy Ziskin, Newton, MA (US)

(73) Assignee: IMATREX, INC., Las Vegas, NV (US)

( * ) Notice: Subject to any disclaimer, the term of this patent is extended or adjusted under 35 U.S.C. 154(b) by 0 days.

(21) Appl. No.: 16/254,203

(22) Filed: Jan. 22, 2019

Related U.S. Application Data (63) Continuation of application No. 15/625,921, filed on Jun. 16, 2017.

(60) Provisional application No. 62/491,122, filed on Apr. 27, 2017.

(51) Int. Cl.
| | | |
|---|---|---|
| H01J 37/147 | (2006.01) | |
| H01J 37/153 | (2006.01) | |
| H01J 37/08 | (2006.01) | |
| H01J 37/317 | (2006.01) | |
| H01J 37/26 | (2006.01) | |

(52) U.S. Cl.
CPC .......... *H01J 37/1475* (2013.01); *H01J 37/08* (2013.01); *H01J 37/153* (2013.01); *H01J 37/266* (2013.01); *H01J 37/3174* (2013.01); *H01J 2237/1526* (2013.01); *H01J 2237/2806* (2013.01); *H01J 2237/31749* (2013.01)

(58) Field of Classification Search
USPC .................................................. 250/396 ML
See application file for complete search history.

(56) References Cited

U.S. PATENT DOCUMENTS

| | | | |
|---|---|---|---|
| 3,622,679 A | 11/1971 | Kennedy | |
| 3,814,829 A | 6/1974 | Movchan et al. | |
| 4,105,890 A | 8/1978 | Movchan et al. | |
| 6,160,262 A | 12/2000 | Aoki et al. | |
| 6,292,538 B1 | 9/2001 | Hell et al. | |
| 2010/0001204 A1 | 1/2010 | White | |
| 2011/0123061 A1* | 5/2011 | Kamimura | H04R 9/025 381/412 |
| 2014/0376090 A1* | 12/2014 | Terajima | G02B 27/646 359/557 |

(Continued)

FOREIGN PATENT DOCUMENTS

| | | |
|---|---|---|
| JP | S50117727 U | 9/1975 |
| JP | S5225562 A | 2/1977 |

(Continued)

OTHER PUBLICATIONS

European Patent Office, Extended European Search Report for European Patent Application No. 18168953.0, 11 pages, dated Sep. 20, 2018.

(Continued)

*Primary Examiner* — Kiet T Nguyen
(74) *Attorney, Agent, or Firm* — Seth Z. Kalson (57) ABSTRACT

A particle beam device including a magnet, the device including: a particle beam source configured to emit electron and ion beams; a plurality of yokes arranged in a substantially rectangular shape; a coil set including a plurality of coils, wherein windings of the plurality of coils are uniformly distributed across and wound around the plurality of yokes, wherein the coil set is configured to produce both dipole and quadrupole fields, wherein the magnet is configured to deflect and focus electron and ion beams.

20 Claims, 10 Drawing Sheets

(56) References Cited

U.S. PATENT DOCUMENTS

| | | | |
|---|---|---|---|
| 2016/0097823 A1* | 4/2016 | Feldmeier | G01R 33/0029 324/251 |
| 2016/0189913 A1 | 6/2016 | Eisner | |
| 2018/0315578 A1 | 11/2018 | Rand et al. | |

FOREIGN PATENT DOCUMENTS

| | | | |
|---|---|---|---|
| WO | 1998009313 A1 | 3/1998 |
| WO | 2008044194 A2 | 4/2008 |
| WO | 2016106425 A2 | 6/2016 |

OTHER PUBLICATIONS

Japanese Office Action, for JP Application No. 2018-082367, English Translation, 5 pages, dated Mar. 5, 2019.

\* cited by examiner

COMPACT DEFLECTING MAGNET

CROSS-REFERENCE TO RELATED APPLICATIONS

This application is a continuation of U.S. patent application Ser. No. 15/625,921, filed Jun. 16, 2017, which claims priority to U.S. Provisional Patent Application No. 62/491,122, filed on Apr. 27, 2017. The contents of the above-referenced applications are expressly incorporated herein by reference in their entireties.

BACKGROUND

Field of the Disclosure

The present disclosure relates to magnets, and more specifically, to compact magnets for deflection and focusing of electron and ion beams.

Background

Many charged particle beam devices require beam deflecting, scanning and focusing magnets. The devices include, among others, Cathode Ray Tubes, X-ray Tubes, Electron Beam Computed Tomography Scanners, Klystrons, Scanning Electron Microscopes, Helium Ion Microscopes, Electron and Ion Lithography Devices.

It would be desirable for the beam-deflecting magnets to have a uniform (dipole) magnetic field and also produce a quadrupole focusing field. The magnets should be scan-able through a range of deflection angles and the field components should be magnetically rotatable about the initial beam axis. Past solutions to the above-mentioned design requirements of the magnets have generally involved complex magnetic coil arrangements.

SUMMARY

The present disclosure is directed to magnets for deflection and focusing of electron and ion beams. In one implementation, the magnet produces dipole and quadrupole fields from the same coil set.

In one implementation, a particle beam device including a magnet is disclosed. The device includes: a particle beam source configured to emit electron and ion beams; a plurality of yokes arranged in a substantially rectangular shape; a coil set including a plurality of coils, wherein windings of the plurality of coils are uniformly distributed across and wound around the plurality of yokes, wherein the coil set is configured to produce both dipole and quadrupole fields, wherein the magnet is configured to deflect and focus electron and ion beams.

In another implementation, a magnet is disclosed. The magnet includes: a plurality of yokes arranged in a substantially rectangular shape; a coil set including a plurality of coils, wherein windings of the plurality of coils are uniformly distributed across and wound around the plurality of yokes, wherein the coil set is configured to produce both dipole and quadrupole fields.

Other features and advantages should be apparent from the present description which illustrates, by way of example, aspects of the disclosure.

BRIEF DESCRIPTION OF THE DRAWINGS

The details of the present disclosure, both as to its structure and operation, may be gleaned in part by study of the appended drawings, in which like reference numerals refer to like parts, and in which.

DETAILED DESCRIPTION

As described above, past solutions to the above-mentioned design requirements for beam deflecting magnets have generally involved complex magnetic coil arrangements. Certain implementations of the present disclosure provide an alternative solution which significantly reduces the complexity of the magnet design. That is, alternative solution includes the magnet which produces dipole and quadrupole fields from the same coil set in contrast to the prior design in which the dipole and quadrupole fields are produced by separate sets of coils.

Further, the design of the alternative solution described here is not only simple, but unlike some conventional designs, the magnet can also be assembled around the beam tube after the tube is completed. Further, the newly-designed magnet is capable of producing greater deflection angles than conventional designs. After reading these descriptions, it will become apparent how to implement the disclosure in various implementations and applications. However, although various implementations of the present disclosure will be described herein, it is understood that these implementations are presented by way of example only, and not limitation. As such, this detailed description of various implementations should not be construed to limit the scope or breadth of the present disclosure.

Figure 1:
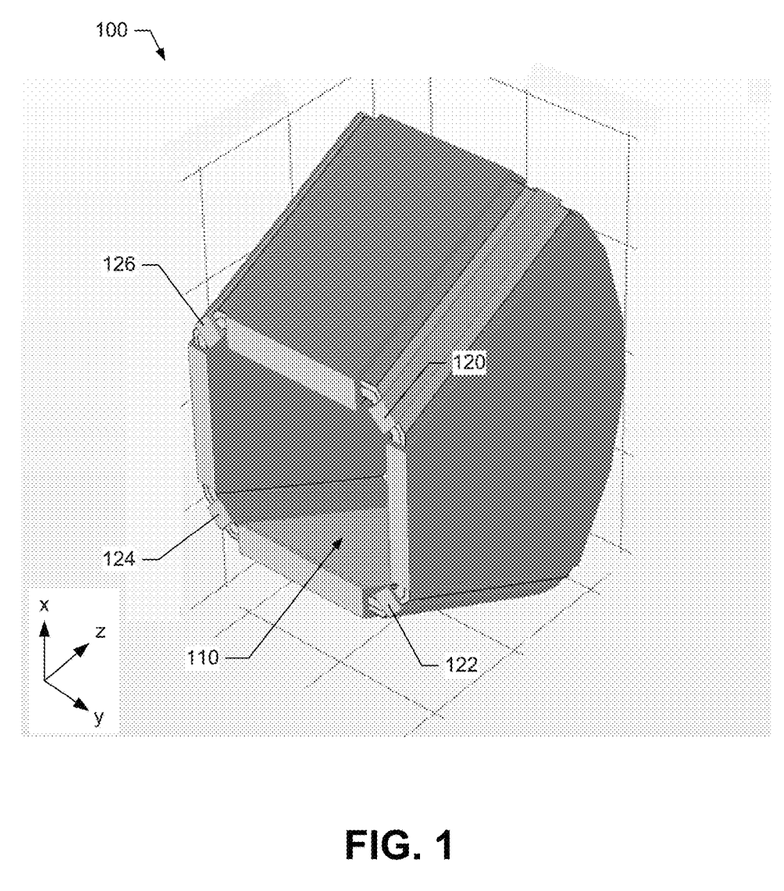
FIG. 1 is a 3-D view of a compact magnet in accordance with one implementation of the present disclosure.

FIG. 1 is a 3-D view of a compact magnet 100 in accordance with one implementation of the present disclosure. In one implementation, the compact magnet 100 is used in a particle beam device such as a cathode ray tube, X-ray tube, electron beam computed tomography scanner, klystron, scanning electron microscope, helium ion microscope, or electron and ion lithography device. The particle beam device may also include a particle beam source, in addition to the magnet. Thus, in one implementation, the compact magnet 100 is used for deflection and focusing of electron and ion beams emitted by the particle beam source.

In the illustrated implementation of FIG. 1, the compact magnet 100 is a horn-shaped with an inlet opening 110 that is substantially rectangular in shape (in the x-y plane). In an alternative implementation, the substantially rectangular shape also includes octagonal corners 120, 122, 124, 126 (e.g., the corners are in 45° angles). In one implementation, the coils in the octagonal corners 120, 122, 124, 126 are configured as quadrupole type B (QB). In one implementation, the exit contour of the yoke on the downstream side is arcuate to provide a quadrupole focusing field which may be used to oppose that of the natural focusing effect, due to deflection, by the uniform field.

Figure 2A:
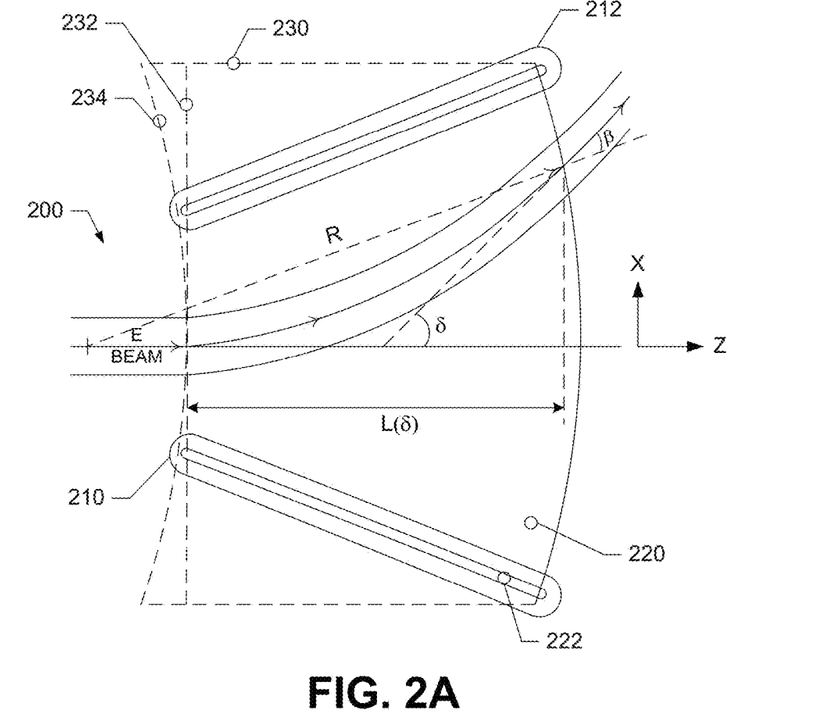
FIG. 2A is a cross-sectional view (x-z plane) of the compact magnet in accordance with one implementation of the present disclosure.

FIG. 2A is a cross-sectional view (x-z plane) 200 of the compact magnet 100 in accordance with one implementation of the present disclosure. The cross-sectional view 200 of FIG. 2A shows coil Y1 (210) and coil Y2 (212) and yokes 220, 222. The design assumes that the beam deflection is mostly in one plane (i.e., the x-z plane). In the illustrated implementation of FIG. 2A, the form is based on a classic "window frame" design which has a very uniform internal dipole magnetic field provided the coil currents are uniformly distributed across the respective faces of the yoke. FIG. 2A also illustrates some alternative shapes 230, 232, 234 for the magnetic yoke and coils for which the magnetic field distribution at the beam would be the same.

Figure 2B:
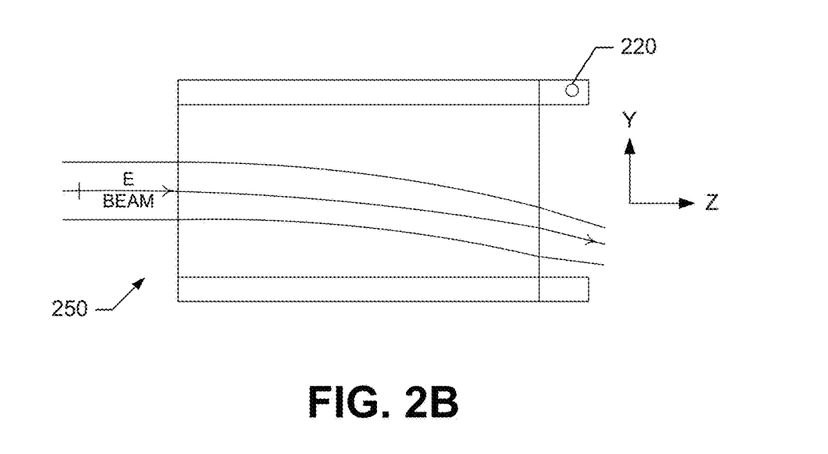
FIG. 2B is another cross-sectional view (y-z plane) of the compact magnet in accordance with one implementation of the present disclosure.

FIG. 2B is another cross-sectional view (y-z plane) 250 of the compact magnet 100 in accordance with one implementation of the present disclosure. The cross-sectional view 250 of FIG. 2B also shows the yoke 220.

Figure 3:
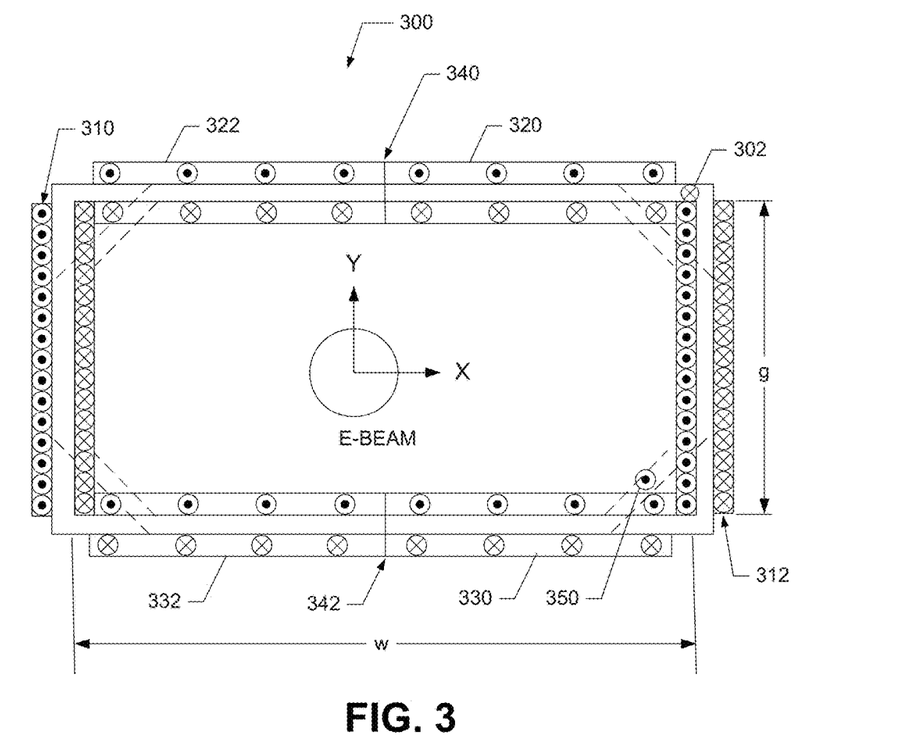
FIG. 3 is another cross-sectional view (x-y plane) of the compact magnet in accordance with one implementation of the present disclosure.

FIG. 3 is another cross-sectional view (x-y plane) 300 of the compact magnet 100 in accordance with one implementation of the present disclosure. In the illustrated implementation of FIG. 3, various coils are shown (designated as coil Y1 (310), coil Y2 (312), coil X1$_L$ (320), coil X1$_R$ (322), X2$_L$ (330), X2$_R$ (332)) with reference to the coordinate system defined in FIGS. 1, 2A, 2B, and 3.

The windings of each coil are uniformly distributed across their respective faces of the yoke. Each pair (L, R) of X coils 320/322 or 330/332 is connected electrically as a single coil although they are mechanically on separate halves of the yoke. The two halves of the yoke are connected at butt joints 340, 342 where there is zero magnetic flux across the joint 340 or 342 due to the dominant magnetic field inside the yoke, $B_y$.

In the illustrated implementation of FIG. 3, the currents in the X coils 320, 322, 330, 332 and the Y coils 310, 312 produce both dipole and quadrupole magnetic fields as described below. Although the cross section shown in FIG. 3 is generally rectangular, its form parallel to the beam direction (in the z direction) may be horn-shaped or parallel-sided. FIG. 3 also shows the optional QB coils (e.g., 350). As described above with respect to FIG. 1, the exit contour of the yoke on the downstream side is arcuate to provide a quadrupole focusing field which may be used to oppose that of the natural focusing effect, due to deflection, by the uniform field. The calculation of the radius for this arc is described below.

The algorithm behind the design of the compact magnet 100 shown as different views in FIGS. 1, 2A, 2B, and 3 is described below. Thus, in one case, the coil currents of the compact magnet 100 may be written as follows:

$$I_{Y1} = I_{DY} + I_{QY}; \qquad [1]$$

$$I_{Y2} = I_{DY} - I_{QY}; \qquad [2]$$

$$I_{X1} = I_{DX} + I_{QX}; \qquad [3]$$

$$I_{X2} = I_{DX} - I_{QX}. \qquad [4]$$

where $I_{DY}$=the dipole current in coil Y,
$I_{QY}$=the quadrupole current in coil Y,
$I_{DX}$=the dipole current in coil X,
$I_{QX}$=the quadrupole current in coil X, and
all four component currents are independent.

Using Ampere's Circuital law, the coil currents described in Equations [1]-[4] produce the magnetic field in the region of the beam as follows:

$$B_y = \frac{\mu_o}{g}\left[N_Y I_{DY} + \frac{2x}{w}(N_Y I_{QY} + N_X I_{QX})\right] + \text{term} \propto \frac{1}{\mu} \qquad [5]$$

$$B_x = \frac{\mu_o}{g}\left[N_X I_{DX} + \frac{2y}{g}(N_Y I_{QY} + N_X I_{QX})\right] + \text{term} \propto \frac{1}{\mu} \qquad [6]$$

where $N_Y$=the number of turns in each separate Y coil,
$N_X$=the number of turns in each separate X coil,
$\mu_o$=the magnetic permeability constant,
$\mu$=the permeability of the magnetic yoke material,
w=the internal width of the yoke, and
g=the vertical height of the yoke.

Thus, based on the above-described magnetic fields and coil currents, the magnitude of the effective magnetic field gradient is as follows:

$$\frac{\partial B_y}{\partial x} = \frac{\partial B_x}{\partial y} = 2\frac{\mu_o}{gw}(N_Y I_{QY} + N_X I_{QX}). \qquad [7]$$

Accordingly, the quadrupole lens strength can be calculated as follows:

$$Q = L(\delta) * \frac{e*c}{p} * \left(\frac{\partial B_y}{\partial x}\right) \qquad [8]$$

where $L(\delta)$=the effective length of the magnet,
e=the electronic charge,
c=the speed of light, and
p is the beam momentum.

In one implementation, the two Y coils are supplied with separate currents $I_{Y1}$ and $I_{Y2}$. In another implementation, each coil includes two windings, one carrying the dipole current, $I_{DY}$, and the other the quadrupole current, $I_{QY}$. The decision for selecting one implementation over another depends on practical considerations such as the cost of coil drivers.

For non-zero deflections, the dipole component of the magnetic field may be approximated by a thin lens element having both cylindrical and quadrupole focusing strengths in the electron beam-optics system. Thus, in the approximation that $I_{DY}$ is the dominant coil current so that the deflection is entirely in the x-z plane (as shown in FIG. 2A), for a given length of the magnet along the incident beam axis L(0), at a maximum deflection ($\delta$) and a beam exit angle ($\beta$):

$$\sin(\delta) = L(\delta) * \frac{e*c}{p} * B_y \qquad [9]$$

where $$L(\delta) = \frac{1}{2} * L(0) * \left[1 + \frac{\cos\left(\delta - \frac{1}{2}\beta\right)}{\cos\left(\frac{1}{2}\beta\right)}\right]. \quad [10]$$

The radial focusing strength (which is a function of beam radius only and independent of azimuthal angle, φ) of the magnet is then calculated to the first order in $$\frac{g}{L(0)}$$

as follows:

$$S = \frac{\sin(\delta) * \tan(\delta)}{2 * L(\delta)}, \quad [11]$$

and the quadrupole focusing strength is calculated as follows:

$$Q = \frac{\sin(\delta) * [\tan(\delta) - 2 * \tan(\beta)]}{2 * L(\delta)}. \quad [12]$$

The total focusing strength is T=S+Q*cos(2φ). These definitions apply regardless of the shape of the coils and yoke. Thus, it should be sufficient to state that the total focusing strength (T) in the x-z plane is S+Q and in the y-z plane is S−Q.

The corresponding radius of the exit boundary of the yoke is then calculated as follows:

$$R = L(0) \Big/ \left[1 - \frac{\sin\left(\beta - \frac{1}{2} * \delta\right)}{\sin(\delta)}\right], \quad [13]$$

where the necessary values of β and R can be calculated for the required maximum values of δ and Q.

The design value of S at the maximum deflection will determine the required minimum divergence of the incident electron beam. At lesser values of deflection, a solenoid focusing lens can be included in the beam-optical system to compensate for the smaller focusing strength of the dipole field.

Many applications may require the quadrupole focusing strength (Q) to be zero or close to zero. Thus, this may require β≈½*δ and R≈L(0). If Q is to be small but non-zero as in the current application, appropriate values of β and R are chosen to produce the required value of Q at the maximum deflection. At lesser deflections, the quadrupole strength is supplemented by coil current $I_{QY}$ to generate the necessary field gradient $$\left(\frac{\partial B_y}{\partial x}\right)$$

as described above.

In one example implementation, the yoke is a high quality mu-metal (e.g., soft ferromagnetic material with the permeability (μ) greater than 50,000) whose thickness is 1.5 mm or more. The coils are single layers, where each layer uses the 14 American wire gauge (AWG) copper wire wound directly onto the yoke. Thus, using the design dimensions of length (L(0))=125 mm, width (w)=125 mm, and gap (g)=50 mm, for example, the dipole component of the magnetic field required to deflect a 200 kV beam 45° is 94 Gauss. This is provided by 375 Ampere-turns in each of the Y coils. These coils are preferably wound with the turns touching as shown in FIG. 3. This results in $N_y$=28 turns with a maximum wire current of 13.3 A. The maximum vertical deflection of 3.1° is provided by up to 50 Ampere-turns, for example, for each pair of X coils. Each half of each X coil has 10 turns with a current of 2.5 A. The turns of the X coils are widely and uniformly spaced as indicated.

As shown in FIG. 2A, the exit side of the magnet yoke forms an arc which is centered on the beam axis upstream of the magnet. This configuration ensures that, the dipole field of the magnet acts as a converging lens with approximately equal focusing strengths in both planes. At large deflection angles, a quadrupole field is produced at the beam exit by this contour of the yoke, which approximately cancels the effective focusing due to the deflection. The resultant strength of the overall quadrupole lens, for example, is about 0.2 Diopter at a deflection of 45°. For smaller deflection angles, the total quadrupole lens strength is also required to be about the same value. The necessary quadrupole field strength is supplied by opposing currents in the Y coils, for example, of $I_{QY}$=0.33 A. Since $I_{QX}$ is redundant, it is not used.

Figure 4:
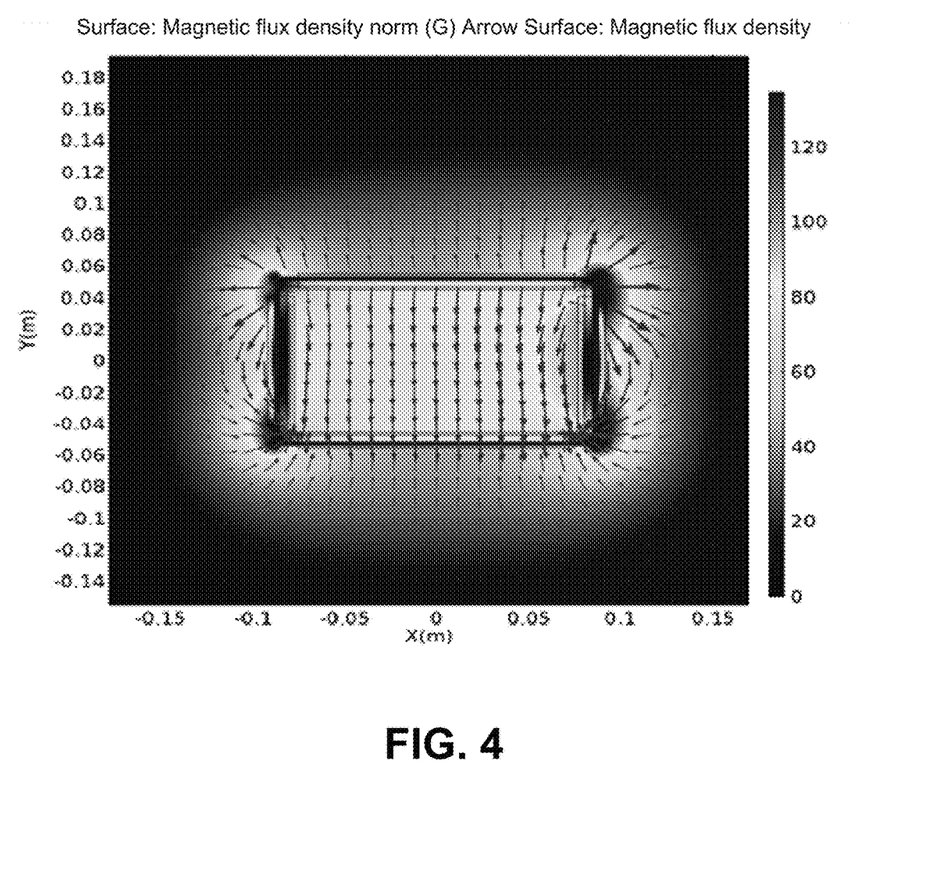
FIG. 4 is an example graph of the dipole magnetic fields ($B_y$) due to equal currents in the two Y coils.

FIG. 4 is an example graph of the dipole magnetic fields ($B_y$) due to equal currents in the two Y coils.

Figure 5:
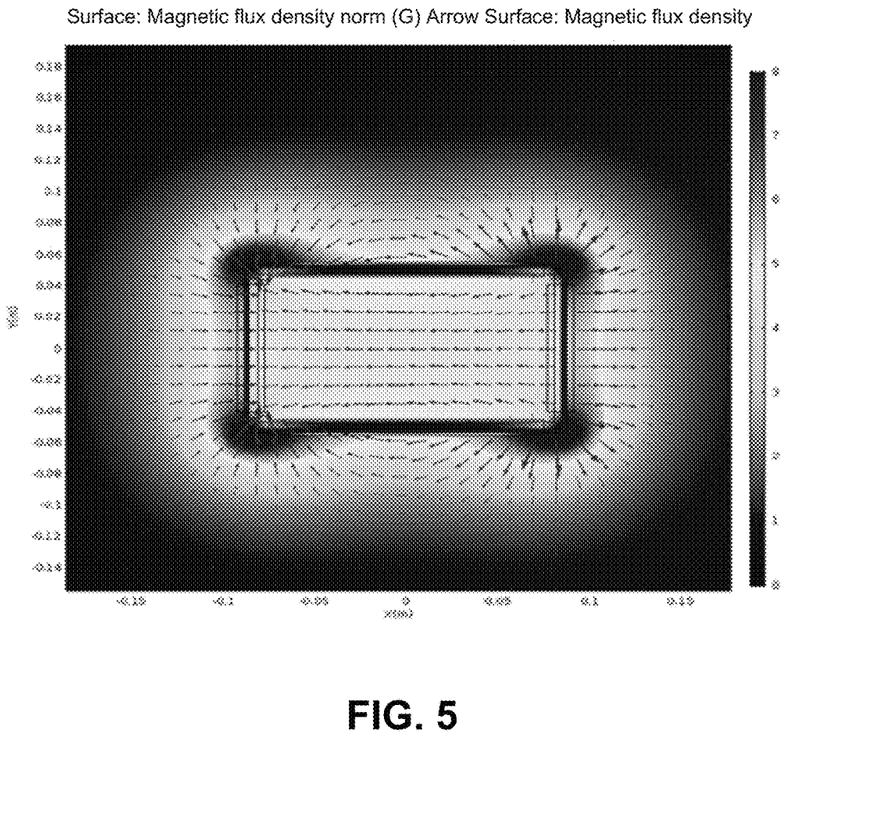
FIG. 5 is an example graph of the dipole magnetic fields ($B_x$) due to equal currents in the two X coils.

FIG. 5 is an example graph of the dipole magnetic fields ($B_x$) due to equal currents in the two X coils.

Figure 6:
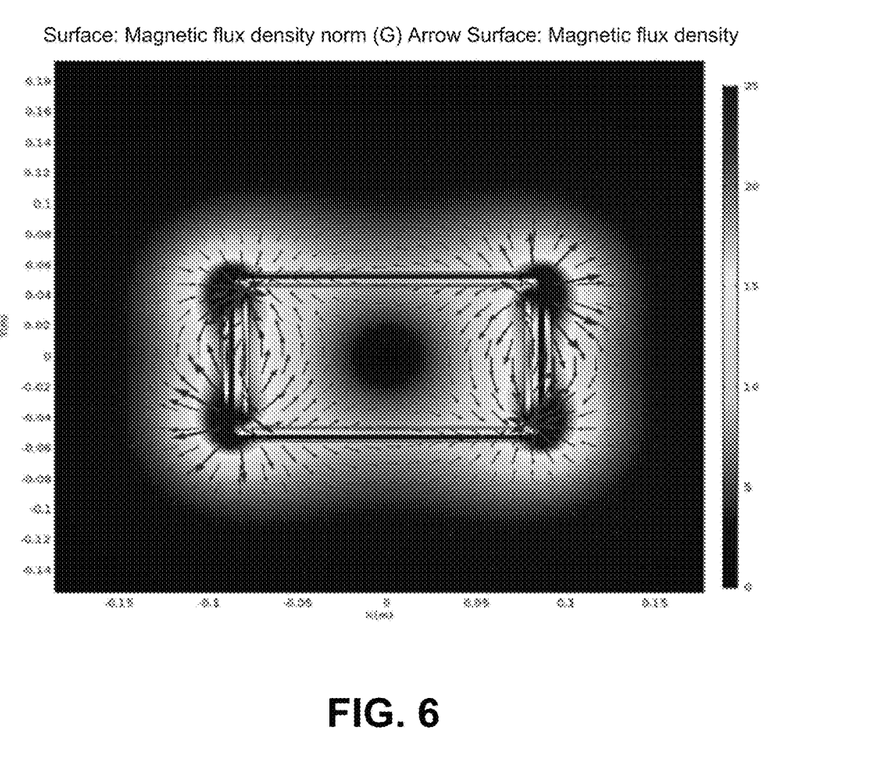
FIG. 6 is an example graph of the quadrupole magnetic fields due to opposing currents in the two Y coils.

FIG. 6 is an example graph of the quadrupole magnetic fields due to opposing currents in the two Y coils.

Figure 7:
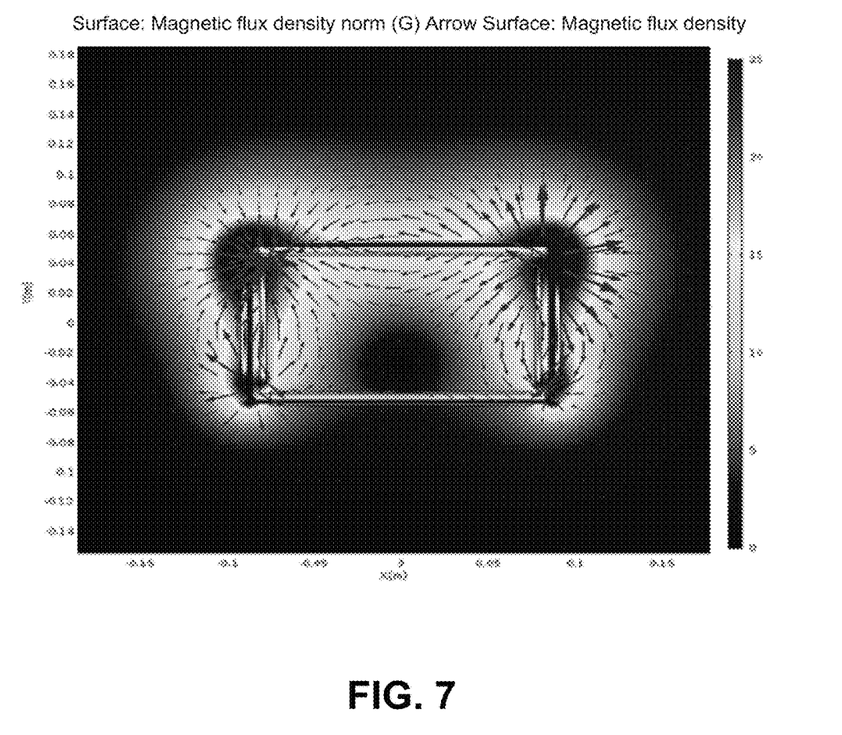
FIG. 7 is an example graph of the combined dipole and quadrupole magnetic fields, due to combined currents in the two Y coils.

FIG. 7 is an example graph of the combined dipole and quadrupole magnetic fields, due to combined currents in the two Y coils.

In an alternative implementation of using an octagonal option for rotatable quadrupole fields, if the required beam profile following deflection is elliptical and is not oriented with its major axes vertical or horizontal, an orthogonal quadrupole field may be required (oriented at 45° with respect to the coordinate axes) to combine with the quadrupole fields of the main coils. The positions of the QB coils 350 required to produce such fields are indicated in FIG. 3 and illustrated in FIG. 1.

Figure 8:
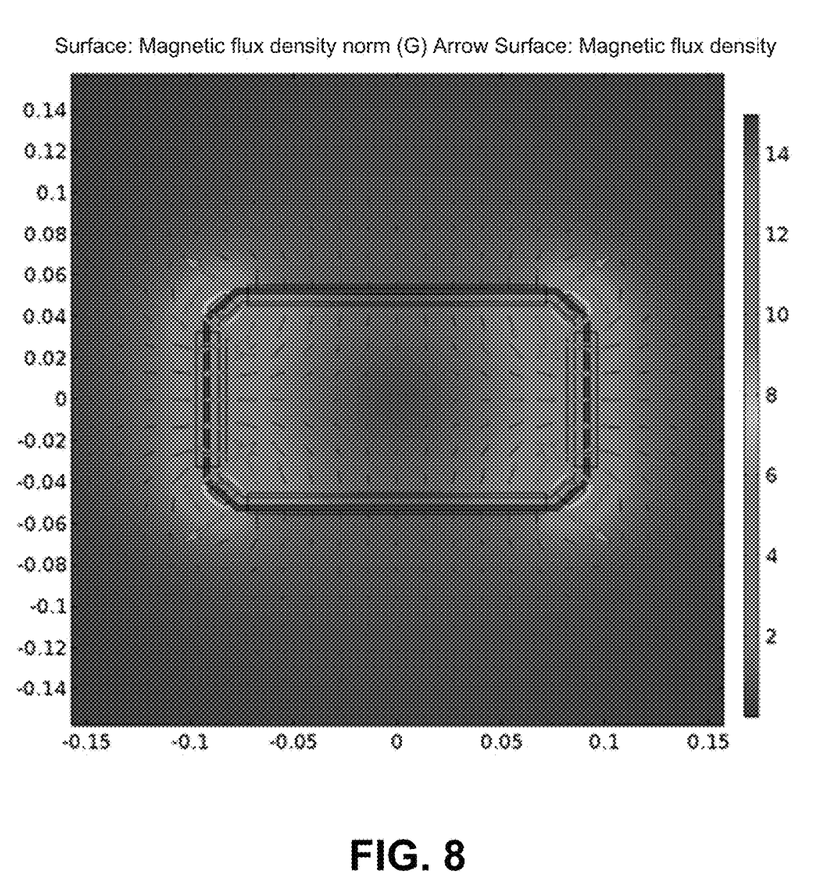
FIG. 8 shows an example of the 45° quadrupole magnetic fields due to the currents in the four QB coils at the corners of the yoke.

FIG. 8 shows an example of the 45° quadrupole magnetic fields due to the currents in the four QB coils at the corners of the yoke.

Figure 9:
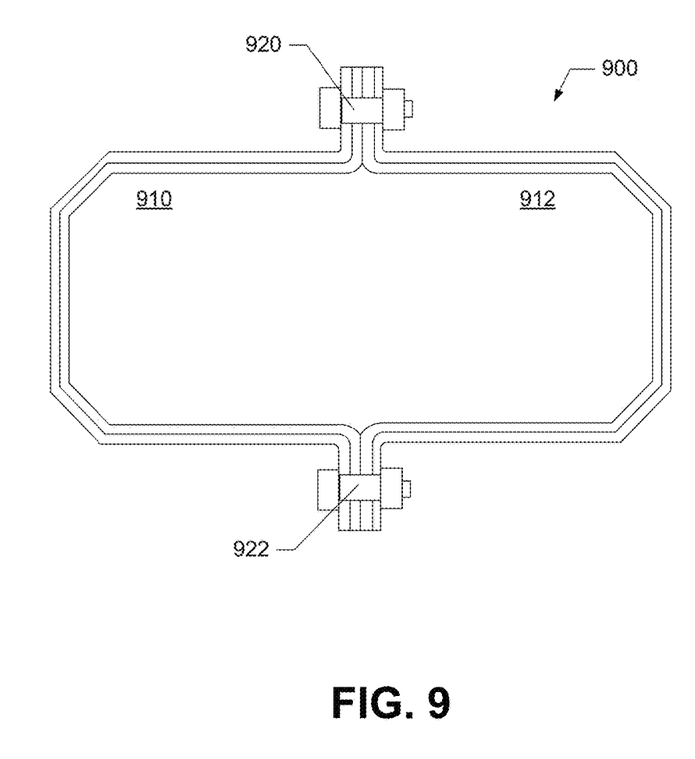
FIG. 9 shows a yoke configured into two halves in accordance with one implementation of the present disclosure.

FIG. 9 shows a yoke 900 configured into two halves 910, 912 in accordance with one implementation of the present disclosure. In the illustrated implementation of FIG. 9, the two halves 910, 912 are clamped together at points 920, 922 where the magnetic induction in the mu-metal is near zero for the main deflection field. The clamp facilitates attachment to a beam tube system. In one implementation, the two halves 910, 912 may be fastened by non-magnetic strips which are attached by brass screws.

Figure 10:
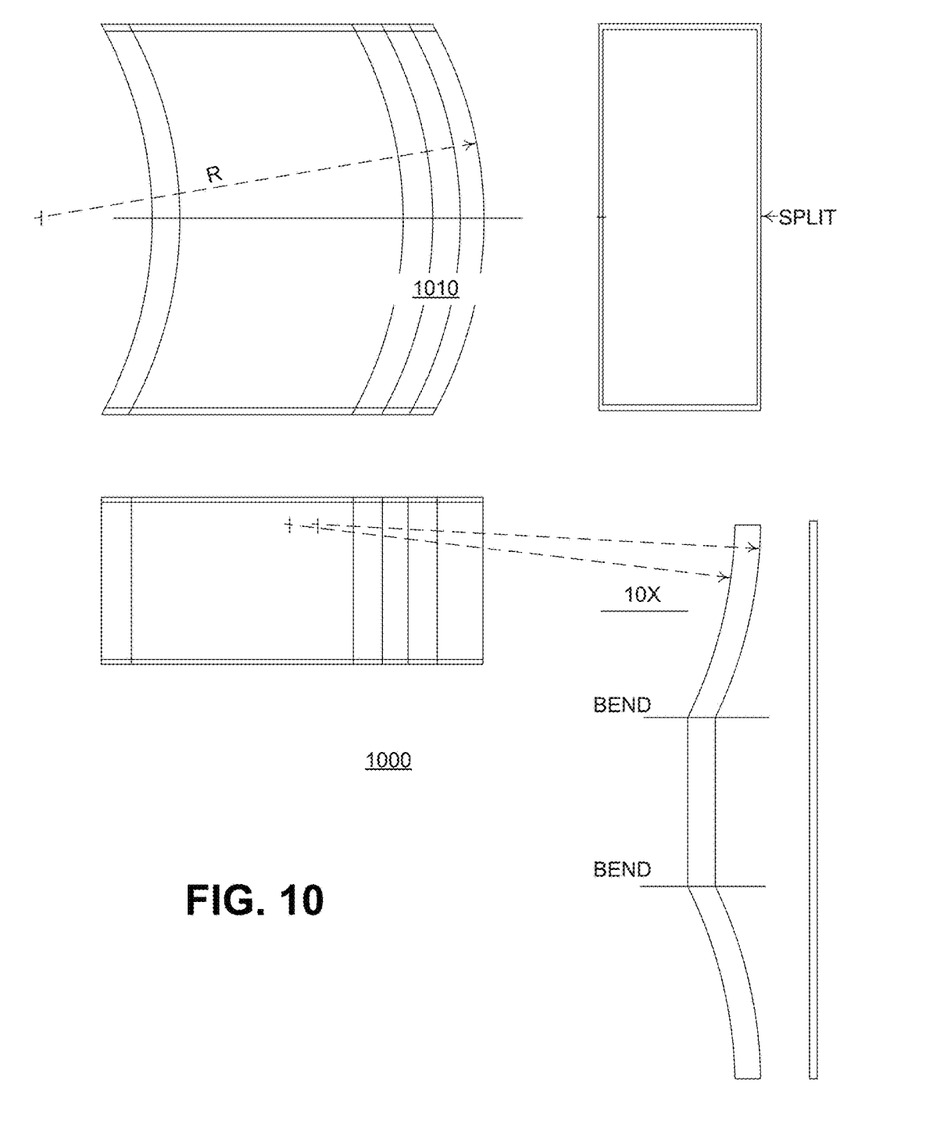
FIG. 10 shows one implementation of the present disclosure in which the magnetic yoke of a parallel sided magnet is divided into identical strips.

In one implementation, if the magnet 1000 is to be used in a scanning beam tube where the coil currents and magnetic fields must change rapidly, it may be necessary to prevent induced eddy currents in the magnetic yoke. This can be achieved by slotting the mu-metal and/or using multiple layers 1010 of material. FIG. 10 shows one implementation of the present disclosure in which all the mu-metal strips would be advantageously identical.

Various modifications to these implementations will be readily apparent to those skilled in the art, and the generic principles described herein can be applied to other implementations without departing from the spirit or scope of the disclosure. Accordingly, the techniques are not limited to the specific examples described above. Thus, it is to be understood that the description and drawings presented herein represent a presently possible implementation of the disclosure and are therefore representative of the subject matter that is broadly contemplated by the present disclosure. It is further understood that the scope of the present disclosure fully encompasses other implementations that may become obvious to those skilled in the art and that the scope of the present disclosure is accordingly limited by nothing other than the appended claims.

The invention claimed is:

1. A magnet comprising:
a yoke having a set of four faces and a set of four octagonal corners;
a first set of four coils, each wound, respectively, on the set of four faces; and
a second set of four coils, each wound, respectively, on the set of four octagonal corners.

2. The magnet of claim 1, the second set of four coils electrically connected to each other to provide a quadrupole magnetic field in response to a current in the second set of four coils.

3. The magnet of claim 2, the yoke having an exit side with an arcuate contour.

4. The magnet of claim 3, wherein a pair of faces in the set of four faces have the arcuate contour at the exit side.

5. The magnet of claim 4, the pair of faces parallel to each other.

6. The magnet of claim 5, wherein the yoke is horn-shaped.

7. The magnet of claim 1, the yoke having an exit side with an arcuate contour.

8. The magnet of claim 1, the yoke comprising two parts attached together.

9. The magnet of claim 8, a first part of the two attached parts including a first part of a face, a second part of the two attached parts including a second part of the face, wherein a coil in the first set of coils wound on the face comprises:
a first part coil wound on the first part of the face; and
a second part coil wound on the second part of the face, the second part coil electrically connected to the first part coil to form the coil.

10. The magnet of claim 1, the yoke comprising mu-metal.

11. A system comprising:
a beam tube system;
a magnet attached to the beam tube system, the magnet comprising:
a yoke having a set of four faces and a set of four octagonal corners;
a first set of four coils, each wound, respectively, on the set of four faces; and
a second set of four coils, each wound, respectively, on the set of four octagonal corners; and
a particle beam source to emit electrons, the magnet attached to the beam tube system to deflect the emitted electrons in response to a current in the first set of four coils.

12. The system of claim 11, the yoke having an exit side with an arcuate contour, the magnet to provide a converging lens for the emitted electrons in response to a current in the first set of four coils.

13. The system of claim 11, the magnet having a window frame design to deflect the emitted electrons in a first plane and a second plane in response to a current in the first set of four coils.

14. The system of claim 13,
the yoke having an exit side with an arcuate contour;
the magnet to provide a converging lens for the emitted electrons in the first and second planes in response to a current in the first set of four coils; and
the second set of four coils electrically connected to each other to provide a quadrupole magnetic field in response to a current in the second set of four coils.

15. The system of claim 11, the yoke comprising mu-metal.

16. A system comprising:
a particle beam source to emit electrons;
a beam tube; and
a magnet attached to the beam tube, the magnet comprising:
a first pair of coils and a second pair of coils to provide magnetic dipole fields to deflect the emitted electrons, respectively, in a first plane and a second plane; and
a set of four coils to provide a quadrupole magnetic field to orient a major axis of an elliptical beam profile of the emitted electrons.

17. The system of claim 16, the yoke having an exit side with an arcuate contour, the first and second pairs of coils to provide a converging lens for the emitted electrons.

18. The system of claim 16, the set of four coils electrically connected to each other to provide the quadrupole magnetic field in response to a current in the set of four coils.

19. The system of claim 16, the yoke comprising mu-metal.

20. The system of claim 16,
the first pair of coils comprising a first set of two electrically connected coils; and
the second pair of coils comprising a second set of two electrically connected coils.

* * * * *